(12) United States Patent
Kuo et al.

(10) Patent No.: US 11,121,307 B2
(45) Date of Patent: Sep. 14, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Wei Kuo, Tainan (TW); Chia-Chang Hsu, Kaohsiung (TW); Yu-Tsung Lai, Tainan (TW); Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 133 days.

(21) Appl. No.: 16/575,414

(22) Filed: Sep. 19, 2019

(65) Prior Publication Data
US 2021/0057637 A1    Feb. 25, 2021

(30) Foreign Application Priority Data
Aug. 22, 2019    (CN) .......................... 201910778695.9

(51) Int. Cl.
*H01L 27/22* (2006.01)
*H01L 43/02* (2006.01)
*G11C 11/16* (2006.01)
*H01L 43/12* (2006.01)

(52) U.S. Cl.
CPC ............ *H01L 43/02* (2013.01); *G11C 11/161* (2013.01); *H01L 27/228* (2013.01); *H01L 43/12* (2013.01)

(58) Field of Classification Search
CPC ............................ H01L 27/222; H01L 27/224
USPC ........................................................... 257/108
See application file for complete search history.

(56) References Cited

U.S. PATENT DOCUMENTS

| 8,917,531 B2 | 12/2014 | Annunziata et al. |
| 10,109,525 B1 | 10/2018 | Lu et al. |
| 2009/0209050 A1* | 8/2009 | Wang ...................... H01L 43/12 438/3 |

* cited by examiner

*Primary Examiner* — Elias Ullah
(74) *Attorney, Agent, or Firm* — Winston Hsu (57) ABSTRACT

A method for fabricating semiconductor device includes the steps of: forming a first magnetic tunneling junction (MTJ) and a second MTJ on a substrate; forming a first top electrode on the first MTJ and a second top electrode on the second MTJ; forming a cap layer on the first MTJ and the second MTJ; forming a passivation layer on the cap layer; removing part of the passivation layer to form a recess between the first MTJ and the second MTJ; forming an anti-reflective layer on the passivation layer and filling the recess; and removing the anti-reflective layer, the passivation layer, and the cap layer to form a first contact hole.

13 Claims, 9 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a first magnetic tunneling junction (MTJ) and a second MTJ on a substrate; forming a first top electrode on the first MTJ and a second top electrode on the second MTJ; forming a cap layer on the first MTJ and the second MTJ; forming a passivation layer on the cap layer; removing part of the passivation layer to form a recess between the first MTJ and the second MTJ; forming an anti-reflective layer on the passivation layer and filling the recess; and removing the anti-reflective layer, the passivation layer, and the cap layer to form a first contact hole.

According to another aspect of the present invention, a semiconductor device includes: a first magnetic tunneling junction (MTJ) and a second MTJ on a substrate; a first top electrode on the first MTJ and a second top electrode on the second MTJ; a cap layer on each of the first MTJ and the second MTJ; and a first metal interconnection between the first MTJ and the second MTJ, wherein one sidewall of the first metal interconnection contacts the cap layer and another sidewall of the first metal interconnection not contacting the cap layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
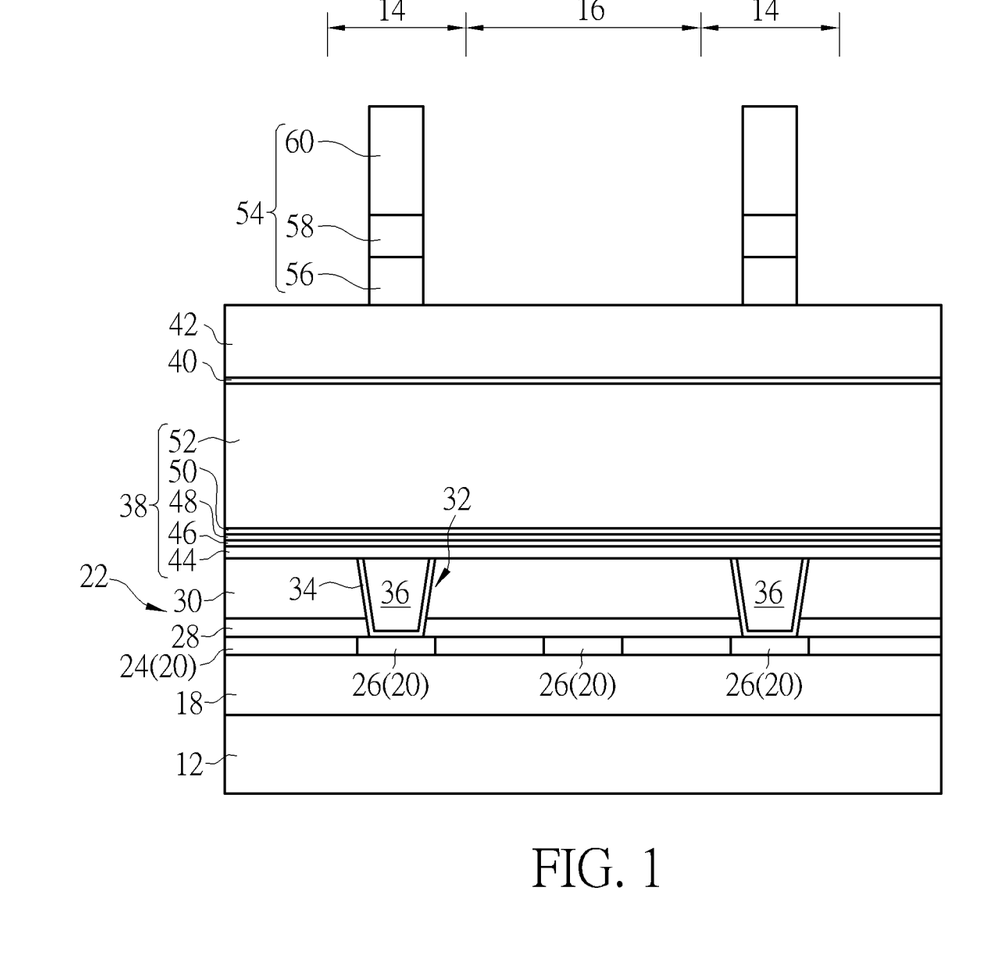
FIGS. 1-9 illustrate a method for fabricating a semiconductor device according to an embodiment of the present invention.

Referring to FIGS. 1-9, FIGS. 1-9 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and each of the metal interconnections 32 from the metal interconnect structure 22 on the MTJ region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a MTJ stack 38 or stack structure is formed on the metal interconnect structure 22, a cap layer 40 is formed on the MTJ stack 38, and another cap layer 42 formed on the cap layer 40. In this embodiment, the formation of the MTJ stack 38 could be accomplished by sequentially depositing a first electrode layer 44, a fixed layer 46, a barrier layer 48, a free layer 50, and a second electrode layer 52 on the IMD layer 30. In this embodiment, the first electrode layer 44 and the second electrode layer 52 are preferably made of conductive material including but not limited to for example Ta, Pt, Cu, Au, Al, or combination thereof. The fixed layer 46 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 46 is formed to fix or limit the direction of magnetic moment of adjacent layers. The barrier layer 48 could be made of insulating material including but not limited to for example oxides such as aluminum oxide ($AlO_x$) or magnesium oxide (MgO). The free layer 50 could be made of ferromagnetic material including but not limited to for example iron, cobalt, nickel, or alloys thereof such as cobalt-iron-boron (CoFeB), in which the magnetized direction of the free layer 50 could be altered freely depending on the influence of outside magnetic field. Preferably, the cap layer 40 and cap layer 42 are made of different materials. For instance, the cap layer 40 is preferably made of silicon nitride and the cap layer 42 is made of silicon oxide, but not limited thereto.

Next, a patterned mask 54 is formed on the cap layer 42. In this embodiment, the patterned mask 54 could include an organic dielectric layer (ODL) 56, a silicon-containing hard mask bottom anti-reflective coating (SHB) 58, and a patterned resist 60.

Figure 2:
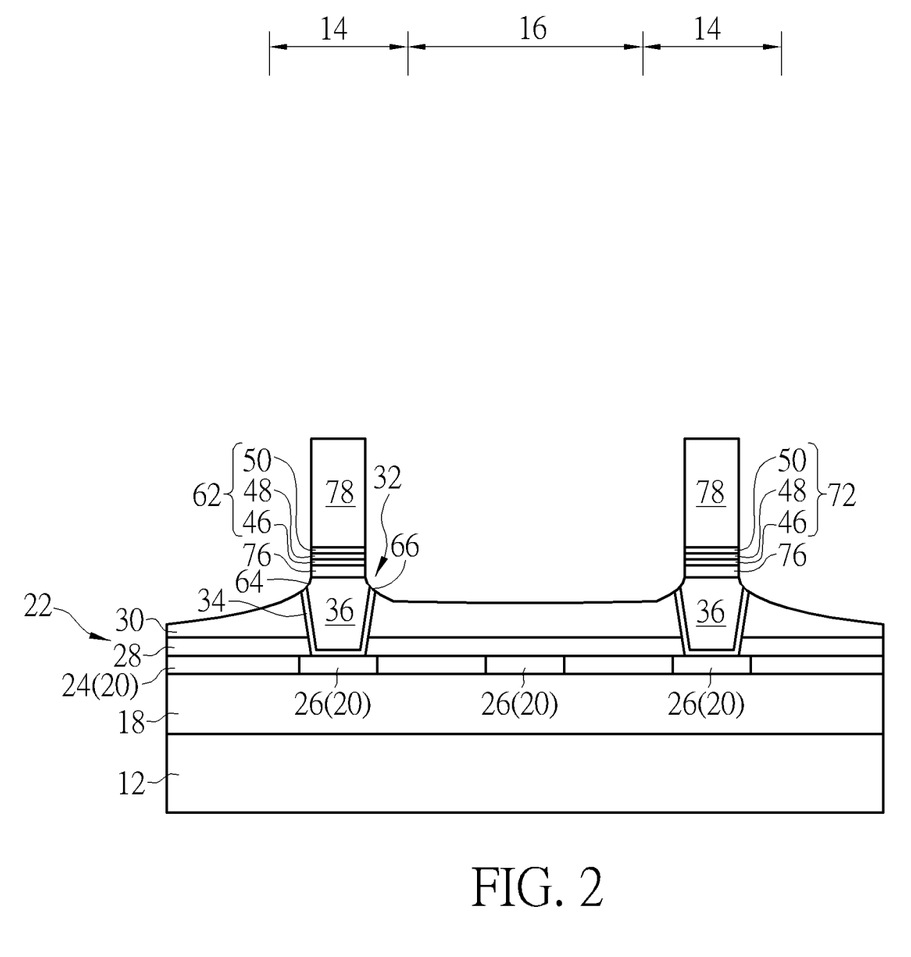

Next, as shown in FIG. 2, one or more etching process is conducted by using the patterned mask 54 as mask to remove part of the cap layers 40, 42, part of the MTJ stack 38, and part of the IMD layer 30 to form MTJ 62 and MTJ 72 on the MTJ region 14, in which the first electrode layer 44 at this stage preferably becomes a bottom electrode 76 for the MTJs 62, 72 while the second electrode layer 52 becomes a top electrode 78 for the MTJs 62, 72 and the cap layers 40, 42 could be removed during the etching process. It should be noted that this embodiment preferably conducts a reactive ion etching (RIE) process by using the patterned mask 54 as mask to remove part of the cap layers 40, 42 and part of the MTJ stack 38, strips the patterned mask 54, and then conducts an ion beam etching (IBE) process by using the patterned cap layer 42 as mask to remove part of the MTJ stack 38 and part of the IMD layer 30 to form MTJs 62, 72. Due to the characteristics of the IBE process, the top surface of the remaining IMD layer 30 is slightly lower than the top surface of the metal interconnections 32 after the IBE process and the top surface of the IMD layer 30 also reveals a curve or an arc.

It should also be noted that when the IBE process is conducted to remove part of the IMD layer 30, part of the metal interconnections 32 are removed at the same time so that a first slanted sidewall 64 and a second slanted sidewall 66 are formed on the metal interconnections 32 adjacent to the MTJ 62, in which each of the first slanted sidewall 64 and the second slanted sidewall 66 could further include a curve (or curved surface) or a planar surface.

Figure 3:
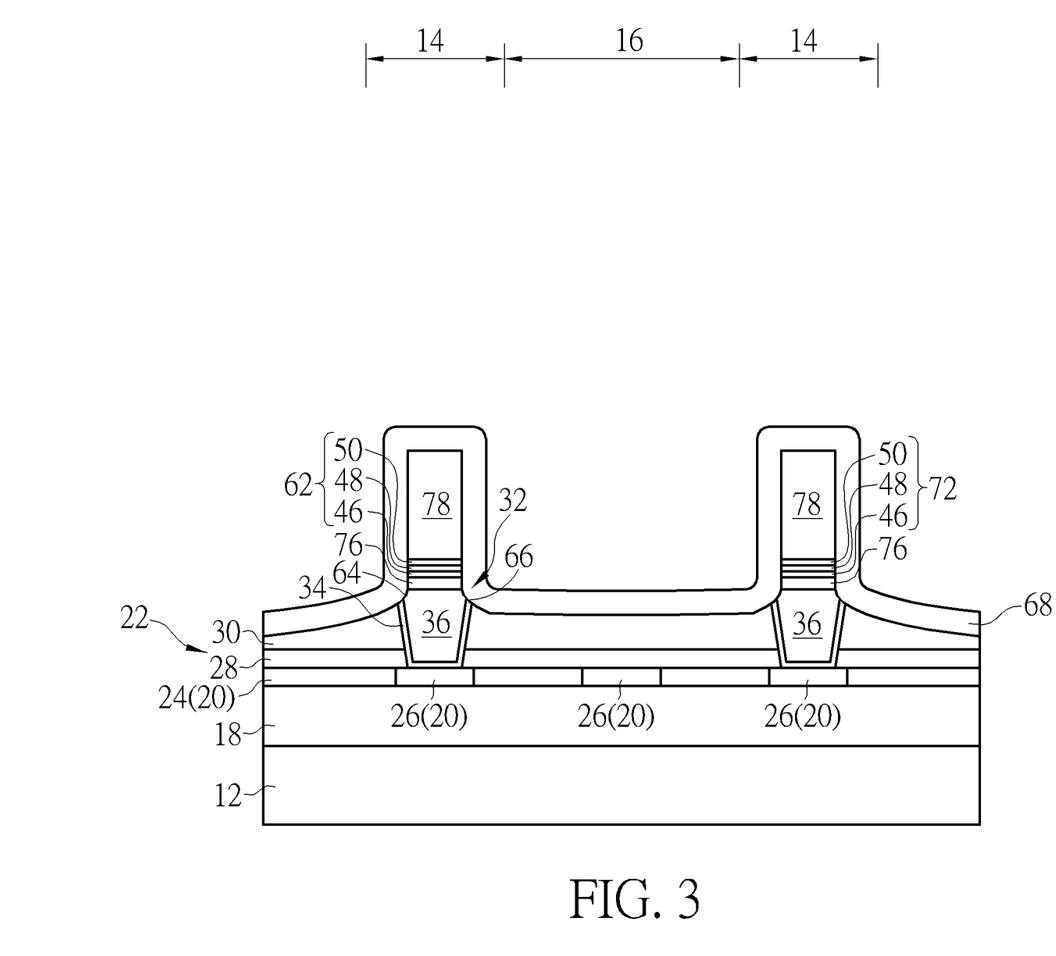

Next, as shown in FIG. 3, a cap layer 68 is formed on the MTJ 62, 72 to cover the surface of the IMD layer 30. In this embodiment, the cap layer 68 is preferably made of silicon nitride, but could also be made of other dielectric material including but not limited to for example silicon oxide, silicon oxynitride, or silicon carbon nitride.

Figure 4:
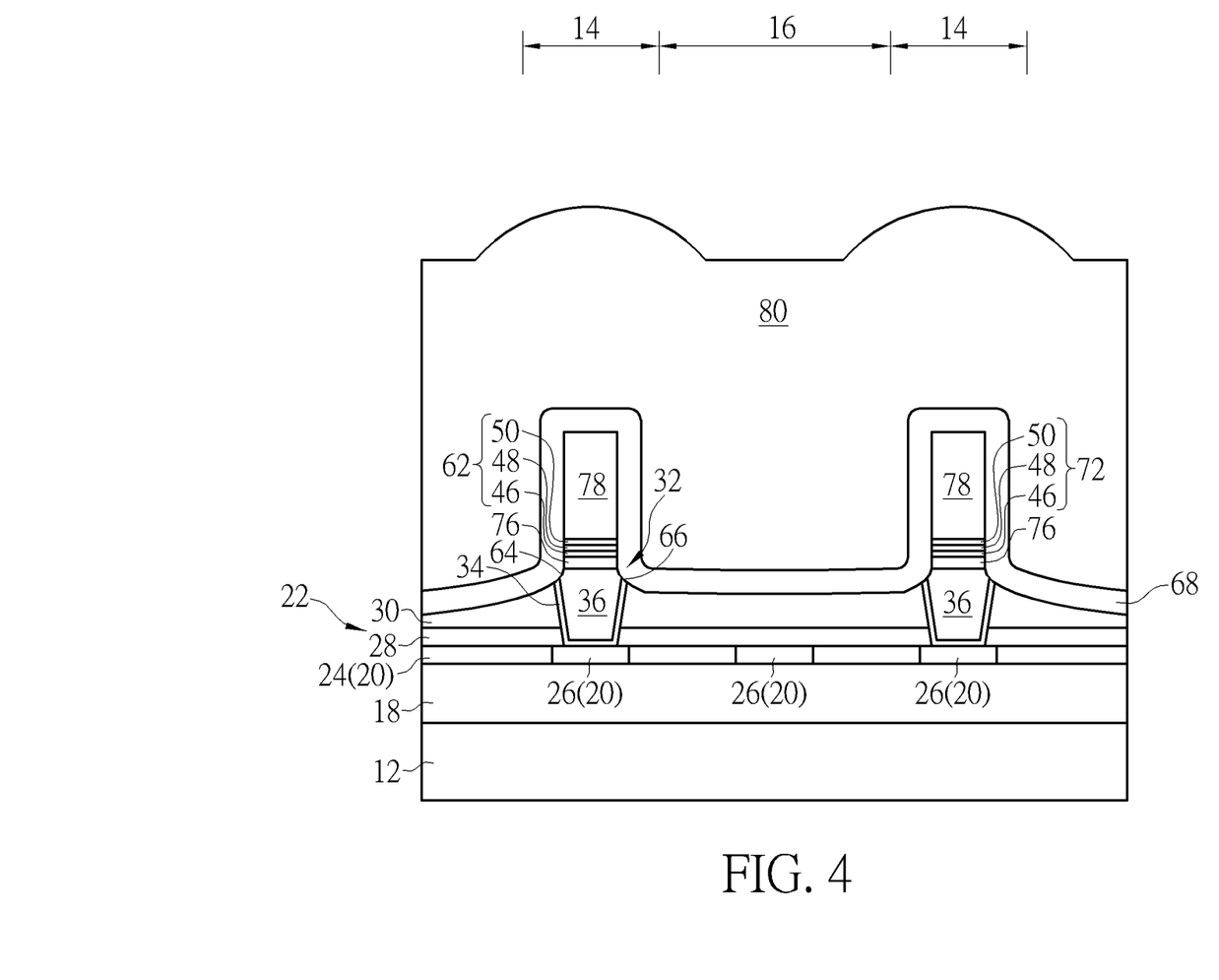

Next, as shown in FIG. 4, a passivation layer 80 is formed on the cap layer 68, in which the topmost surface of the passivation layer 80 directly on top of the MTJs 62, 72 is slightly higher than the top surface of the passivation layer 80 between the MTJs 62, 72. In this embodiment, the passivation layer 80 preferably includes but not limited to for example tetraethyl orthosilicate (TEOS), silicon oxide, silicon nitride, or combination thereof.

Figure 5:
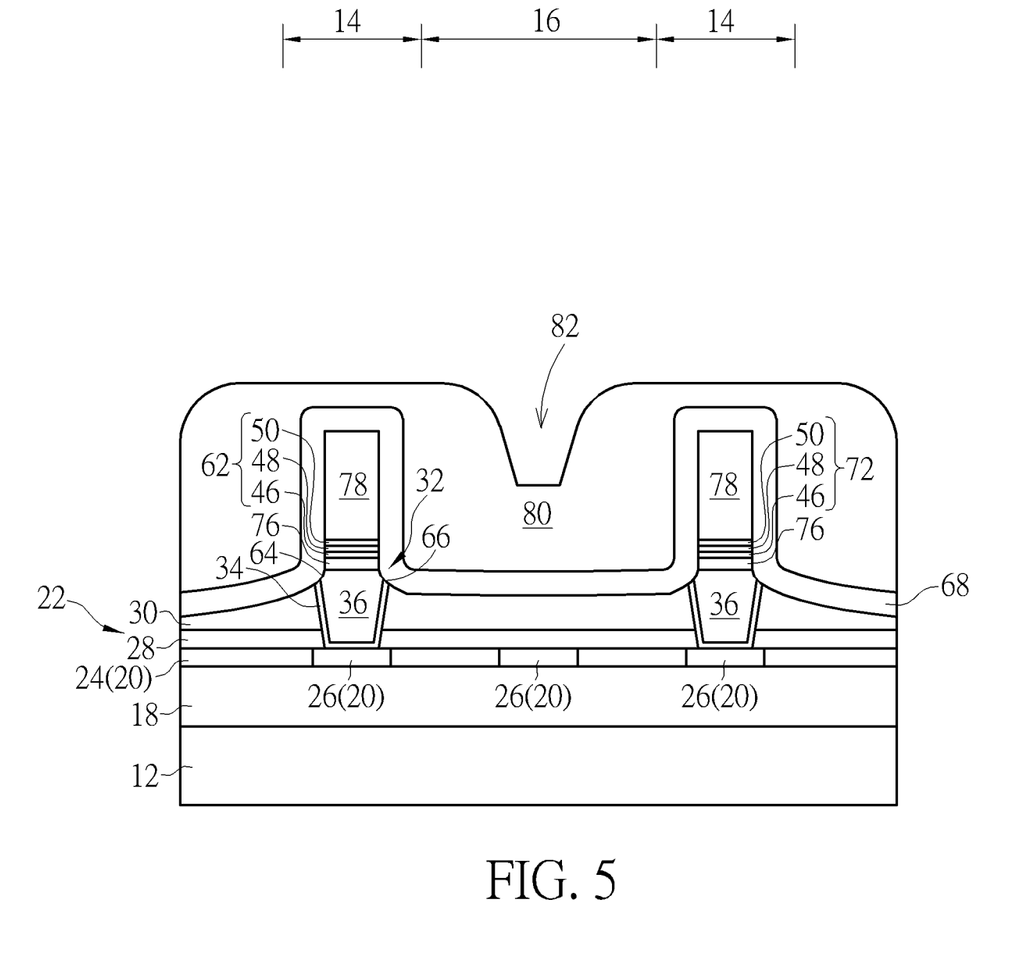

Next, as shown in FIG. 5, part of the passivation layer 80 is removed to form a recess 82 between the MTJs 62, 72. Specifically, an etching process is preferably conducted without forming any patterned mask to remove part of the passivation layer 80 for forming a recess 82 directly on top of the metal interconnection 26 on the logic region 16 or between the MTJs 62, 72, in which the bottom or bottommost surface of the recess 82 is slightly higher than the bottom of the MTJs 62, 72 and lower than the top surface of the top electrodes 78.

Figure 6:
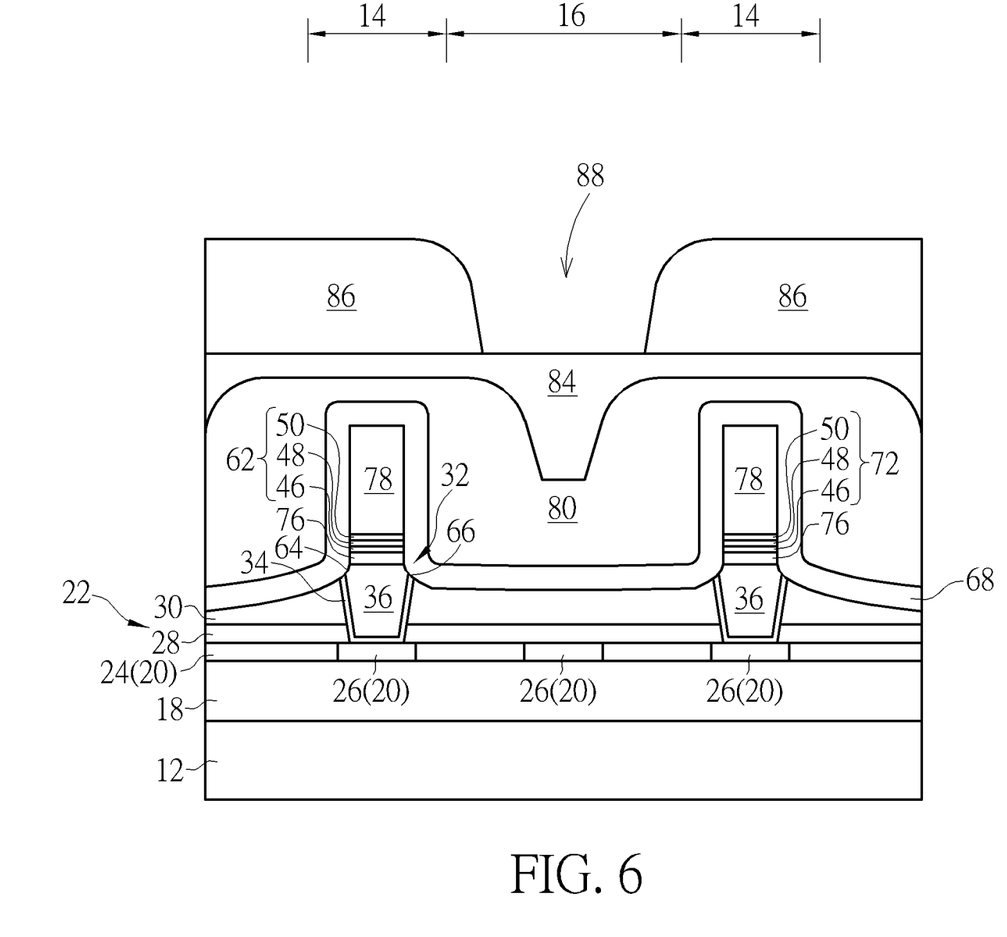

Next, as shown in FIG. 6, an anti-reflective layer such as a bottom anti-reflecting coating (BARC) 84 is formed on the passivation 80 to fill the recess 82 completely, and then a patterned mask 86 such as a patterned resist is formed on the BARC 84, in which the patterned mask 86 includes an opening 88 exposing the surface of part of the BARC 84 on the logic region 16.

Figure 7:
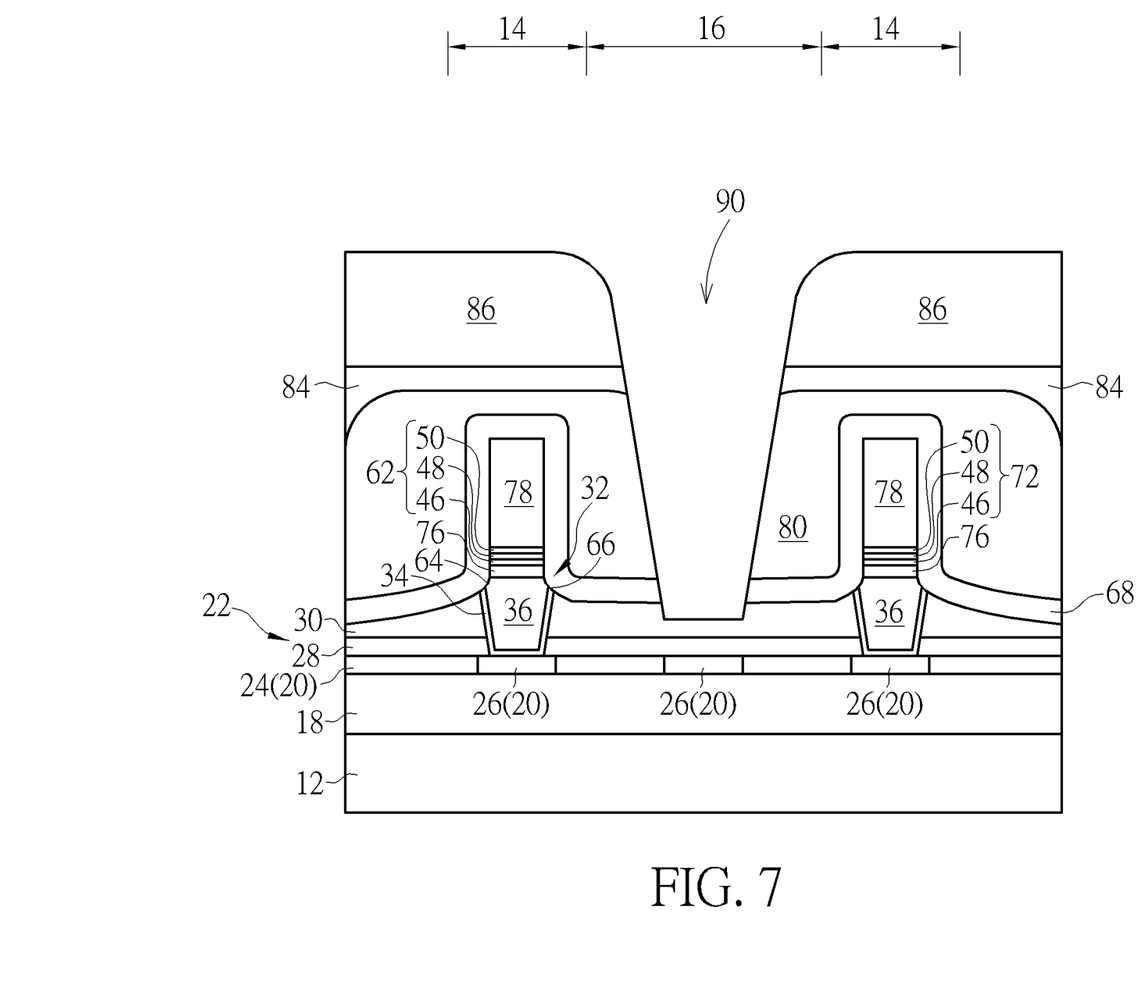

Next, as shown in FIG. 7, the patterned mask 86 is used as mask to remove part of the BARC 84, part of the passivation layer 80, part of the cap layer 68, and even part of the IMD layer 30 to form a contact hole 90 directly on the metal interconnection 26 on the logic region 16. It should be noted that even though the bottommost surface of the contact hole 90 is slightly lower than the bottom surface of the cap layer 68, according to another embodiment of the present invention, the bottommost surface of the contact hole 90 could also be even with the bottom of the cap layer 68, which is also within the scope of the present invention.

Figure 8:
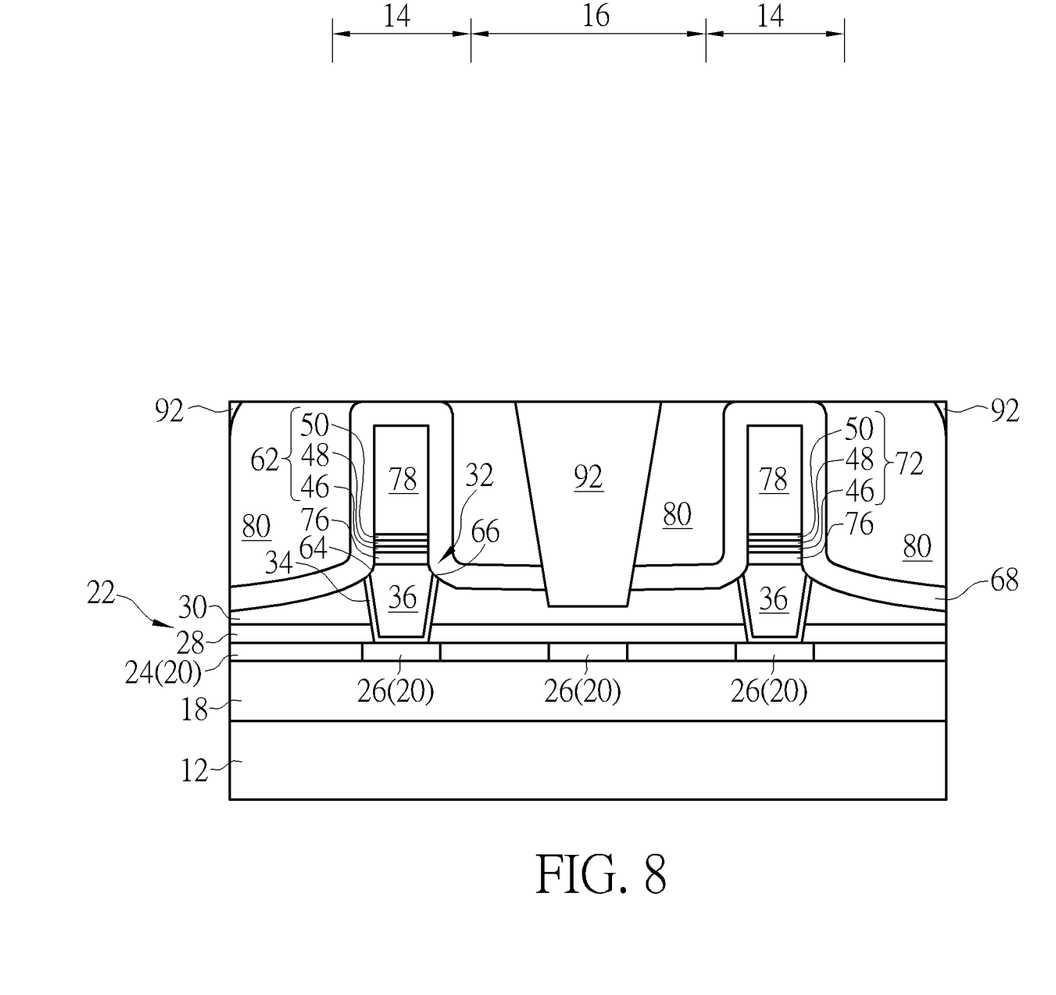

Next, as shown in FIG. 8, the patterned mask 86 and the BARC 84 are stripped, and an ultra low-k (ULK) dielectric layer 92 is formed on the passivation layer 90 to fill the contact hole 92 completely. In this embodiment, the ULK dielectric layer 92 could include porous dielectric materials including but not limited to for example silicon oxycarbide (SiOC). Next, a planarizing process such as a chemical mechanical polishing (CMP) process is conducted to remove part of the ULK dielectric layer 92 so that the top surfaces of the cap layer 68 on the MTJ region 14 and the ULK dielectric layer 92 on the logic region 16 are coplanar.

Figure 9:
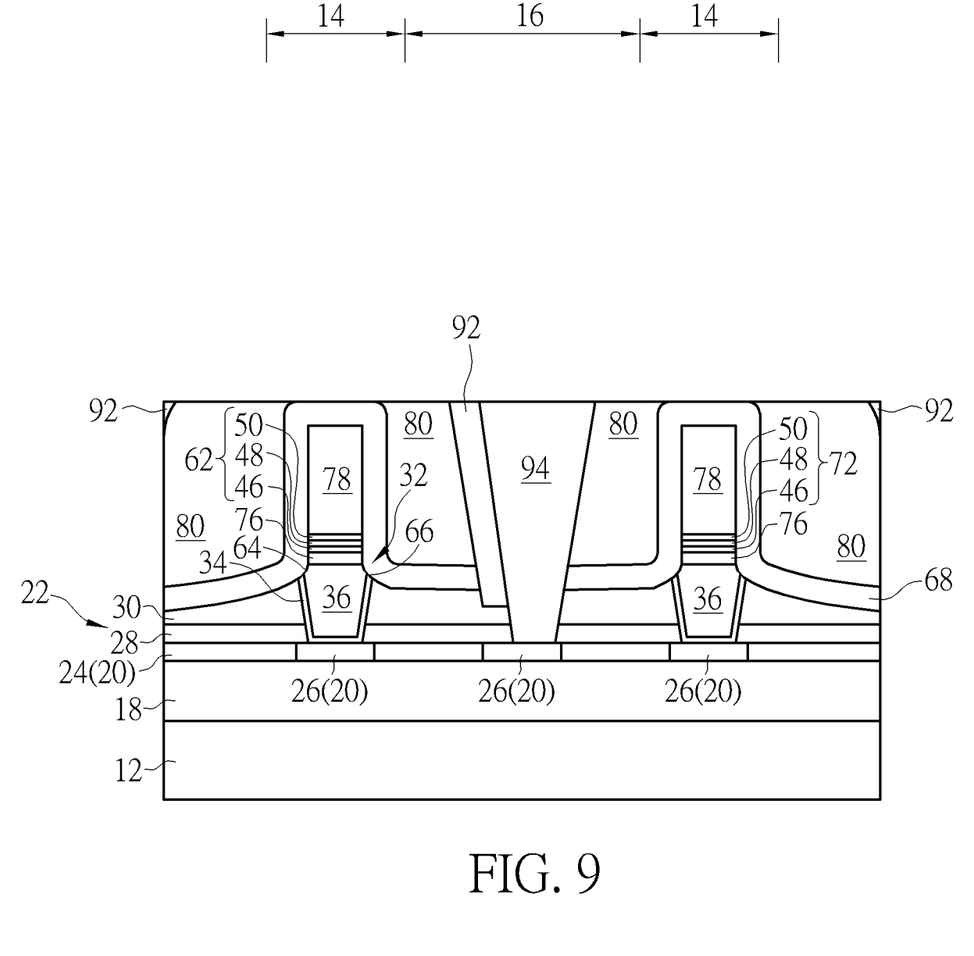

Next, as shown in FIG. 9, one or more photo-etching process is conducted to remove part of the ULK dielectric layer 92 and part of the IMD layer 30 on the logic region 16 to form another contact hole (not shown) exposing the metal interconnection 26 underneath. Next, conductive materials are deposited into the contact hole and another planarizing process such as CMP is conducted to form a metal interconnection 94 directly connecting the metal interconnection 26 on the logic region 16.

Similar to the aforementioned metal interconnections 26, the metal interconnection 94 formed between the MTJs 62, 72 on the logic region 16 could be fabricated according to a single damascene or dual damascene process depending on the demand of the process. For instance, the metal interconnection 94 could further includes a barrier layer (not shown) and a metal layer (not shown), in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity.

Referring again to FIG. 9, FIG. 9 further illustrates a structural view of a semiconductor device according to an embodiment of the present invention. As shown in FIG. 9, the semiconductor device preferably includes an IMD layer 24 disposed on the substrate 24, metal interconnections 26 disposed within the IMD layer 24 on the MTJ region 14 and logic region 16, an IMD layer 30 disposed on the IMD layer 24, metal interconnections 32 disposed in the IMD layer 30 and connecting the metal interconnections 26 underneath, MTJs 62, 72 disposed on the metal interconnections 32, top electrodes 78 disposed on the MTJs 62, 72 respectively, a cap layer 68 disposed on the MTJs 62, 72, a passivation layer 80 surrounding the MTJs 62, 72, a metal interconnection 94 disposed between the MTJs 62, 72, and a ULK dielectric layer 92 disposed between the passivation layer 80 and the metal interconnection 94.

In this embodiment, one side wall such as the right sidewall of the metal interconnection 94 preferably contacts the cap layer 68 directly while another sidewall such as the left sidewall of the metal interconnection 94 dies not contact the cap layer 68 at all. Specifically, the right sidewall of the metal interconnection 94 preferably contacts the passivation layer 80, the cap layer 68, and the IMD layer 30 directly while the left sidewall of the metal interconnection 94 only contacts the ULK dielectric layer 92 and the IMD layer 30 directly but does not contact any of the cap layer 68. Moreover, the top surfaces of the cap layer 68, the ULK dielectric layer 92, and the metal interconnection 94 are coplanar.

In current fabrication of MRAM devices especially during the formation of metal interconnections or contact plugs on the logic region, issues such as misalignment often arise as a result of overly large or excessive pitch difference between upper and lower level metal interconnections. To resolve this issue, the present invention preferably employs a multi-stage approach to fabricate metal interconnections such as the metal interconnection 94 with desirable size or pitch so that a perfect match between the upper and lower level metal interconnections could be achieved. It should be further noted that when a photo-etching process is conducted in FIGS. 8-9 to remove part of the ULK dielectric layer 92, it would be desirable to place a patterned mask on the passivation layer 80 to expose part of the ULK dielectric layer 92 and the passivation layer 80 at the same time, and then use the etch selectivity between the ULK dielectric layer 92 and the passivation layer 80 to define the size of the metal interconnection 94 so that a much more precise alignment between upper and lower level metal interconnections could be accomplished.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first magnetic tunneling junction (MTJ) and a second MTJ on a substrate;
    forming a first top electrode on the first MTJ and a second top electrode on the second MTJ;
    forming a cap layer on the first MTJ and the second MTJ;
    forming a passivation layer on the cap layer;
    removing part of the passivation layer to form a recess between the first MTJ and the second MTJ;
    forming an anti-reflective layer on the passivation layer and filling the recess; and
    removing the anti-reflective layer, the passivation layer, and the cap layer to form a first contact hole.

2. The method of claim 1, wherein the anti-reflective layer comprises a bottom anti-reflective coating (BARC).

3. The method of claim 1, wherein the substrate comprises a MTJ region and a logic region, the method further comprising:
    forming an inter-metal dielectric (IMD) layer on the substrate;
    forming a first metal interconnection and a second metal interconnection on the MTJ region and a third metal interconnection on the logic region;
    forming the first MTJ on the first metal interconnection and the second MTJ on the second metal interconnection;
    forming the cap layer on the first MTJ and the second MTJ;
    forming the passivation layer on the cap layer;
    forming the BARC on the passivation layer;
    removing the BARC, the passivation layer, and the cap layer to form the first contact hole directly on the third metal interconnection;
    removing the BARC;
    forming an ultra low-k (ULK) dielectric layer on the passivation layer;
    removing the ULK dielectric layer to form a second contact hole exposing the third metal interconnection; and
    forming a fourth metal interconnection in the second contact hole.

4. The method of claim 3, further comprising:
    planarizing the ULK dielectric layer so that top surfaces of the cap layer on the MTJ region and the ULK dielectric layer on the logic region are coplanar before forming the second contact hole; and
    forming the fourth metal interconnection.

5. The method of claim 3, wherein one sidewall of the fourth metal interconnection contacts the ULK dielectric layer and another sidewall of the fourth metal interconnection contacts the passivation layer and the cap layer.

6. The method of claim 3, wherein one sidewall of the fourth metal interconnection contacts the cap layer and another sidewall of the fourth metal interconnection not contacting the cap layer.

7. A semiconductor device, comprising:
    a first magnetic tunneling junction (MTJ) and a second MTJ on a substrate;
    a first top electrode on the first MTJ and a second top electrode on the second MTJ;

a cap layer on each of the first MTJ and the second MTJ; and a first metal interconnection between the first MTJ and the second MTJ, wherein one sidewall of the first metal interconnection contacts the cap layer and another sidewall of the first metal interconnection not contacting the cap layer.

8. The semiconductor device of claim 7, wherein the substrate comprises a MTJ region and a logic region, the semiconductor device further comprising:

an inter-metal dielectric (IMD) layer on the substrate; and
a second metal interconnection and a third metal interconnection on the MTJ region and a fourth metal interconnection on the logic region, wherein the fourth metal interconnection is directly under the first metal interconnection.

9. The semiconductor device of claim 7, further comprising a passivation layer around the first MTJ and the second MTJ.

10. The semiconductor device of claim 9, further comprising an ultra low-k (ULK) dielectric layer between the passivation layer and the first metal interconnection.

11. The semiconductor device of claim 10, wherein one sidewall of the first metal interconnection contacts the cap layer and the passivation layer and another sidewall of the first metal interconnection contacts the ULK dielectric layer.

12. The semiconductor device of claim 10, wherein top surfaces of the cap layer and the ULK dielectric layer are coplanar.

13. The semiconductor device of claim 10, wherein top surfaces of the cap layer, the ULK dielectric layer, and the first metal interconnection are coplanar.

* * * * *